US012669536B2

(12) United States Patent
Raghuraman et al.

(10) Patent No.: US 12,669,536 B2
(45) Date of Patent: Jun. 30, 2026

(54) LOW POWER ARCHITECTURE FOR CHIPLETS

(71) Applicant: QUALCOMM Incorporated, San Diego, CA (US)

(72) Inventors: Praveen Raghuraman, Chennai (IN); Vivek Roopchand, Chennai (IN); Karthikeyan Soundararajan, Chennai (IN)

(73) Assignee: QUALCOMM INCORPORATED, San Diego, CA (US)

( * ) Notice: Subject to any disclaimer, the term of this patent is extended or adjusted under 35 U.S.C. 154(b) by 433 days.

(21) Appl. No.: 18/158,709

(22) Filed: Jan. 24, 2023

(65) Prior Publication Data

US 2024/0248132 A1 Jul. 25, 2024

(51) Int. Cl.
*G01R 31/28* (2006.01)

(52) U.S. Cl.
CPC ..... *G01R 31/2839* (2013.01); *G01R 31/2834* (2013.01)

(58) Field of Classification Search
CPC ......................... G01R 31/2839; G01R 31/2834
See application file for complete search history.

(56) References Cited

U.S. PATENT DOCUMENTS

| | | | | |
|---|---|---|---|---|
| 5,592,493 A | * | 1/1997 | Crouch | G01R 31/318536 714/724 |
| 10,476,740 B1 | * | 11/2019 | Cote | G06F 30/33 |

| | | | | |
|---|---|---|---|---|
| 2009/0193306 A1 | * | 7/2009 | Chakraborty | G01R 31/318536 714/E11.155 |
| 2010/0176838 A1 | * | 7/2010 | Kawasaki | G01R 31/31721 257/E23.079 |
| 2010/0293423 A1 | * | 11/2010 | Goyal | G01R 31/3177 714/E11.155 |
| 2016/0259000 A1 | * | 9/2016 | Robbins | G01R 31/318583 |

FOREIGN PATENT DOCUMENTS

WO 2023164659 8/2023

OTHER PUBLICATIONS

International Search Report and Written Opinion—PCT/US2023/083049—ISA/EPO—Apr. 9, 2024.

* cited by examiner

*Primary Examiner* — Catherine T. Rastovski
*Assistant Examiner* — Nyla Gavia
(74) *Attorney, Agent, or Firm* — Loza & Loza, LLP

(57) ABSTRACT

A method for communicating test information, includes providing a data stream to a circuit block that is implemented on a semiconductor die, demultiplexing data channels from the data stream, multiplexing the data channels to obtain a modified data stream after test information collected from a plurality of sections of the circuit block has been inserted into one or more data channels allocated to at least one section of the circuit block by corresponding embedded distributed test (EDT) circuits implemented in the at least one section of the circuit block, and transmitting the modified data stream to another circuit block implemented on the semiconductor die.

29 Claims, 11 Drawing Sheets

1100

LOW POWER ARCHITECTURE FOR CHIPLETS

TECHNICAL FIELD

The present disclosure relates generally to integrated circuit technology and, more particularly to architectures for embedded distributed testing.

BACKGROUND

Mobile communication devices typically include a variety of components such as circuit boards, integrated circuit (IC) devices, application-specific integrated circuit (ASIC) devices and/or System-on-Chip (SoC) devices. The types of components may include processing circuits, user interface components, storage and other peripheral components that communicate over a serial bus. State-of-the-art mobile application devices demand a small form factor, low cost, a tight power budget, and high electrical performance. For example, wearable processing and communication devices require SoCs and other IC devices that offer higher performance with reduced power requirements in smaller form-factors. Mobile package design has evolved to meet these divergent goals for enabling mobile applications that support multimedia enhancements.

Chiplet technology can be used to address some of the performance, power, size and other design requirements for complex SoCs used in certain mobile or wearable devices. An SoC can be separated into subsystems that may be implemented as individual chiplets. An SoC can be optimized or customized by assembling a subset of available chiplets. The assembled chiplets may communicate with each other via one or more intra-chip data buses or similar data communication interconnects. A mobile application device may include multiple SoCs that communicate with each other via similar inter-chip interconnects.

Mobile application devices can be susceptible to power and signal routing issues when multiple dies are arranged within a small form factor. There is an ongoing need to improve interconnections and testing techniques in chiplet-based SoCs.

SUMMARY

Certain aspects of the disclosure relate to IC devices that include multiple chiplets that are optimized for low-power embedded distributed testing within individual circuit blocks of the chiplets.

In various aspects of the disclosure, an integrated circuit device, includes two or more semiconductor dice, each semiconductor die having at least one circuit block configured to implement a function of the integrated circuit device; a plurality of embedded distributed test (EDT) circuits, each EDT circuit being configured to collect test information from one of a plurality of sections of the at least one circuit block; and a central EDT circuit provided in the circuit block and communicatively coupled to each EDT circuit in the plurality of EDT circuits.

In various aspects of the disclosure, a method for communicating test information, includes providing a data stream to a circuit block that is implemented on a semiconductor die; demultiplexing data channels from the data stream; multiplexing the data channels to obtain a modified data stream after test information collected from a plurality of sections of the circuit block has been inserted into one or more data channels allocated to at least one section of the circuit block by corresponding EDT circuits implemented in the at least one section of the circuit block; and transmitting the modified data stream to another circuit block implemented on the semiconductor die.

In various aspects of the disclosure, an apparatus includes means for providing a data stream to a circuit block that is implemented on a semiconductor die; means for demultiplexing data channels from the data stream; and means for multiplexing the data channels to obtain a modified data stream after test information collected from a plurality of sections of the circuit block has been inserted into one or more data channels allocated to at least one section of the circuit block by corresponding EDT circuits implemented in the at least one section of the circuit block. The modified data stream may be transmitted to another circuit block implemented on the semiconductor die.

In certain aspects, at least one circuit block includes multiple voltage domains, each voltage domain corresponding to one of the plurality of sections of the at least one circuit block. At least one circuit block may be partitioned into sections based on a distribution of interconnects associated with the plurality of EDT circuits. At least one circuit block may be partitioned into sections based on circuit density associated with the plurality of EDT circuits. At least one circuit block may be partitioned into sections to limit a number of isolation clamps associated with the plurality of EDT circuits to a predefined maximum.

In certain aspects, each EDT circuit includes a demultiplexer configured to extract one or more channels in a multiplexed EDT data stream that are allocated to the each EDT circuit and a multiplexer configured to recombine the one or more channels that are allocated to the each EDT circuit into an output EDT data stream. In some instances, the IC device may include a central EDT circuit configured to distribute a plurality of the channels in the multiplexed EDT data stream to the plurality of EDT circuits. The central EDT circuit may be further configured to combine channels output by the plurality of EDT circuits to obtain an output data test data stream.

In certain aspects, the integrated circuit device includes a decoder configured to decompress a plurality of channels that includes channels modified by the plurality of EDT circuits. The plurality of channels may be extracted from a broadcast EDT data stream.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of the invention will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

Data communication links employed by SoCs and other IC devices to connect processors with modems and other peripherals may be operated in accordance with industry or proprietary standards or protocols associated with certain functions or types of devices. In the example of display panels, display subsystems, and display drivers, communication standards and protocols defined by the MIPI Alliance are frequently used. The Display Serial Interface (DSI®), for example, provides C-PHY and D-PHY standards and protocols used to define, configure and control a high-speed serial interface between a host processor and a display module.

According to certain aspects of the disclosure, a serial data link may be used to interconnect electronic devices that are subcomponents of an apparatus such as a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, a wearable computing device (e.g., a smart watch, a health or fitness tracker, eyewear, etc.), an appliance, a sensor, a security device, a vending machine, a smart meter, a drone, a multicopter, or any other similar functioning device.

Figure 1:
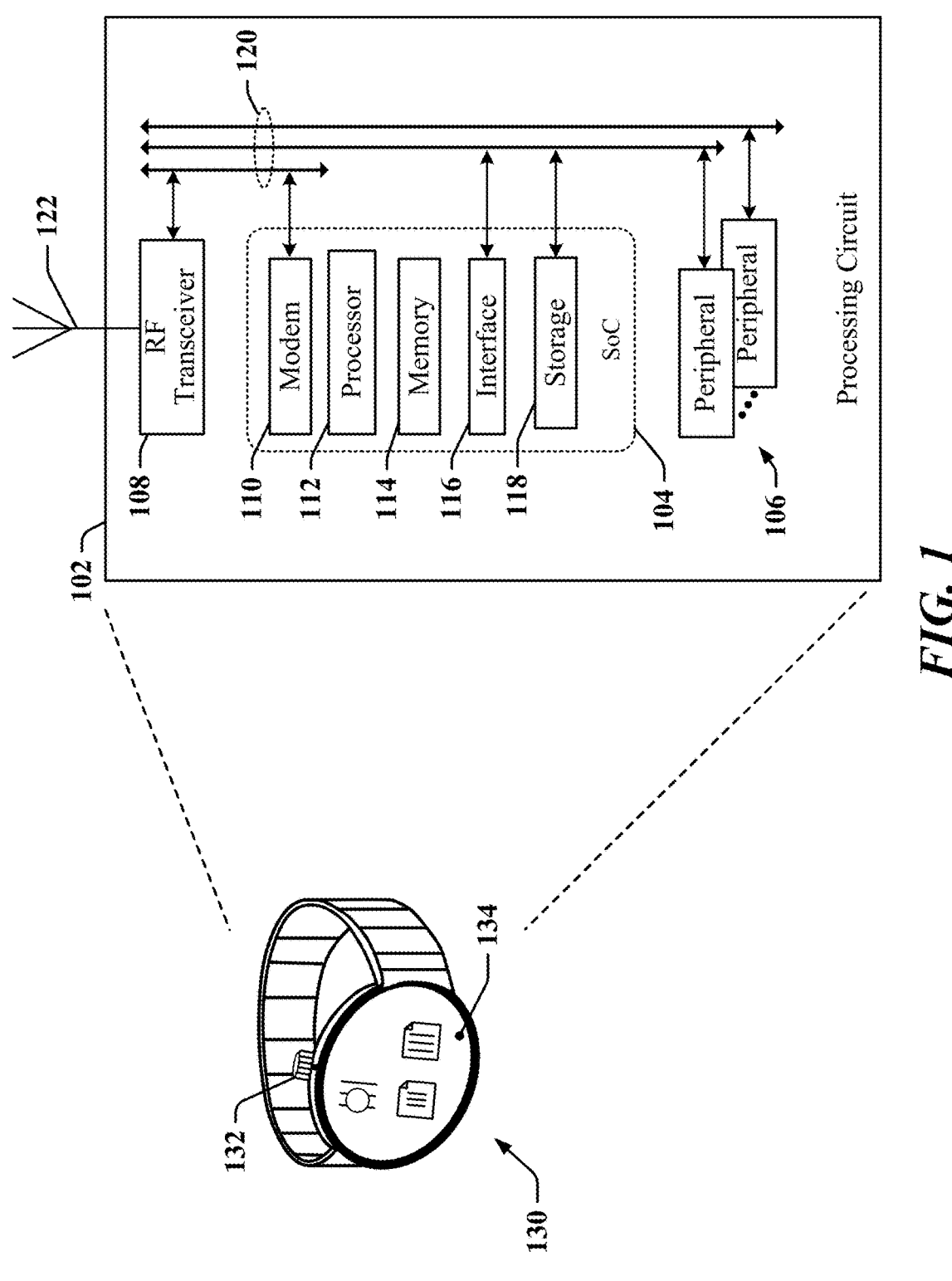
FIG. 1 illustrates an apparatus employing interconnected chiplets.

FIG. 1 illustrates an example of an apparatus 100 that may be implemented using multiple chiplets coupled through one or more data communication buses. The apparatus may be enclosed within a wearable device, such as the illustrated smartwatch 130. A processing circuit 102 of the apparatus 100 includes multiple circuits or devices 104, 106 and/or 108. In various examples, the processing circuit 102 is implemented using one or more ASICs, chiplets, an SoC or other devices arranged in a configuration that can be adapted for use in mobile computing, embedded computing, edge computing. In one example, the apparatus 100 may be configured to support multiple communication technologies, modes or protocols and the processing circuit 102 includes a combination of devices including an SoC 104, one or more peripheral devices 106, and a transceiver 108 that cooperate to enable the apparatus to communicate through an antenna 122 with a radio access network, a core access network, the Internet and/or another network.

The SoC 104 may include one or more processors 112, one or more modems 110, on-board memory 114, a bus interface circuit 116 and/or other logic circuits or functions. The processing circuit 102 may be controlled by an operating system that provides an application programming interface (API) layer that enables the one or more processors 112 to execute software modules residing in the on-board memory 114 or other processor-readable storage 118 provided on the processing circuit 102. The software modules may include instructions and data stored in the on-board memory 114 or processor-readable storage 118. The SoC 104 may access its on-board memory 114, the processor-readable storage 118, and/or storage external to the processing circuit 102. The on-board memory 114, the processor-readable storage 118 may include read-only memory (ROM) or random-access memory (RAM), electrically erasable programmable ROM (EEPROM), flash cards, or any memory device that can be used in processing systems and computing platforms. The processing circuit 102 may include, implement, or have access to a local database or other parameter storage that can maintain operational parameters and other information used to configure and operate the apparatus 100 and/or the processing circuit 102. The local database may be implemented using registers, a database module, flash memory, magnetic media, EEPROM, soft or hard disk, or the like. The processing circuit 102 may also be operably coupled to external devices such as the antenna 122, a display 134, operator controls 132, switches or buttons, among other components. A user interface module may be configured to manage the display 134, operator controls 132, etc. and may communicate with other elements of the processing circuit 102 through one or more serial data interconnects.

The processing circuit 102 may provide multiple buses 120 that enable communication between two or more devices 104, 106, and/or 108. In one example, the SoC 104 may include bus interface circuits 116 coupled to one or more of the buses 120. Each of the bus interface circuits 116 may include a combination of circuits, counters, timers, control logic and other configurable circuits or modules. In one example, certain bus interface circuits 116 may be configured to operate in accordance with standards-defined communication specifications or protocols. The processing circuit 102 may include or control a power management function that configures and manages the operation of the apparatus 100.

The illustrated smartwatch 130, other portable or wearable processing and/or communication devices (referred to collectively as portable communication devices or PCDs), sensors, instruments, appliances and other such devices include one or more ICs. These devices may include mobile phones, tablet computers, palmtop computers, portable digital assistants (PDAs), portable game consoles, and other portable electronic devices. PCDs commonly contain integrated circuits or SoCs that include numerous components or subsystems designed to work together to deliver functionality to a user. The various SoC subsystems may communicate with each other via one or more intra-chip data buses or similar data communication interconnects. PCDs may have multiple SoCs that communicate with each other via similar inter-chip interconnects. The ICs are typically packaged in an IC package, which may be referred to as a "semiconductor package" or "chip package." The IC package typically includes a package substrate and one or more IC chips or other electronic modules mounted to the package substrate to provide electrical connectivity to the IC chips. For example, an IC chip in an IC package may be configured as an SoC. The IC chips are electrically coupled to other IC chips and/or to other components in the IC package through electrical coupling to metal lines in the package substrate. The IC chips can also be electrically coupled to other circuits outside the IC package through electrical connections of external metal interconnects (e.g., solder bumps) of the IC package.

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs. Design rules for newer process technology that use low-voltage transistors may preclude the use of higher voltage transistors supported by previous process technology generations. The unavailability of certain higher-voltage transistors may present an impediment to circuit designers for IC devices that include multiple voltage domains.

Figure 2:
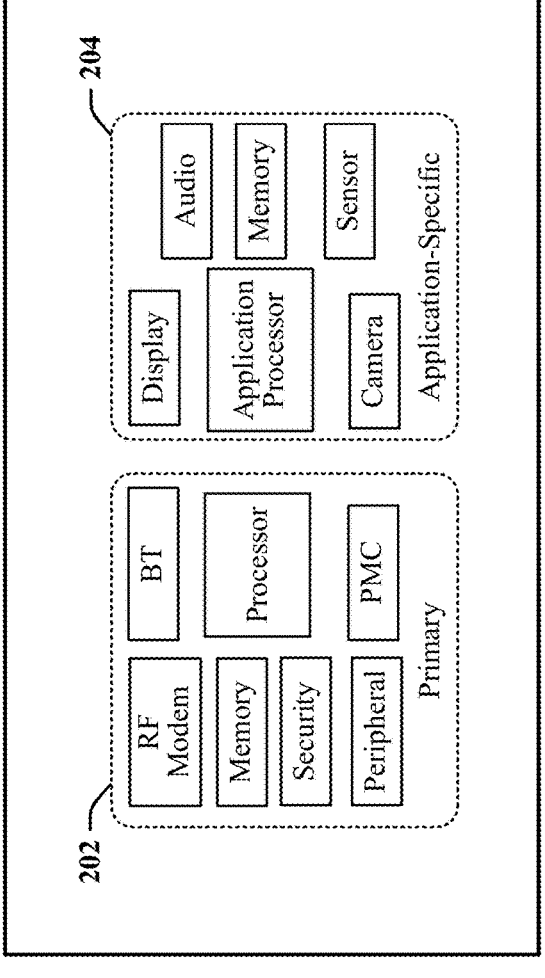
FIG. 2 illustrates certain aspects of an SoC constructed from chiplets.

Chiplet technology can be used to address some of the performance, power and size design requirements for complex SoCs used in certain mobile or wearable devices. The block diagram in FIG. 2 illustrates certain aspects of an SoC 200 that can be constructed using chiplets. The SoC 200 may be configured by selecting a combination of chiplets that implement certain subsystems or distinct functional elements. In the illustrated example, the SoC 200 includes a set of primary chiplets 202 that enable the SoC 200 to perform core processing, security and communication functions. The set of primary chiplets 202 include a processor, memory and one or more modems. The illustrated SoC 200 also includes a set of application-specific chiplets 204 that includes an application processor, display driver, camera interface and audio controller. In a remote sensing device or appliance, the audio-visual components could be omitted and may be replaced with analog-to-digital controllers, for example.

The SoC 200 may include a variety of processing engines, such as central processing units (CPUs) with multiple cores, graphical processing units (GPUs), digital signal processors (DSPs), neural processing units (NPUs), wireless transceiver units (also referred to as modems), peripherals, display and imaging interfaces, etc. Each of these subsystems and other functional elements can be implemented as an individual chiplet, or as a combination of chiplets. The chiplets included in the SoC 200 can be proprietary or may be acquired from a variety of sources. An SoC may be constructed from chiplets manufactured at different process nodes and/or operated at different voltages.

Figure 3:
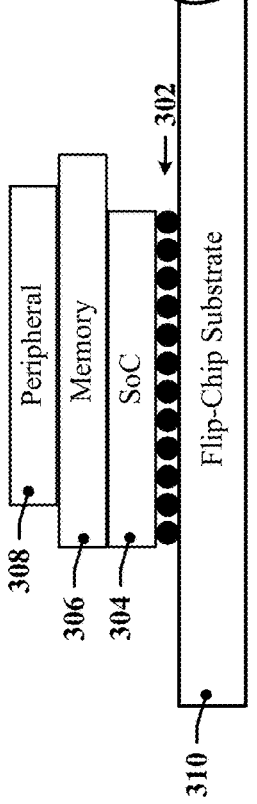
FIG. 3 illustrates an example of an SoC in which chiplets are stacked vertically on a substrate.
Figure 3:

FIG. 3 illustrates an example of an SoC 300 in which certain chiplets 304, 306, 308 are stacked vertically on a substrate 310. Some chiplets can be included in stacks that are deployed across the surface of the substrate 310, while other chiplets may be individually mounted on the surface of the substrate. Chiplets may be mounted on the surface of the substrate using solder balls 302 that provide electrical and/or thermal coupling between substrate and the mounted chiplets. An interconnect structure may be formed that enables chiplets 304, 306, 308 in a stack of chiplets to communicate with one another, with other chiplets mounted on the substrate 310 and with input/output structures that connect the SoC 200 with other circuits, displays, imaging sensors and other peripherals with an apparatus.

The use of chiplets can reduce the areal size of the substrate 310 and increase three-dimensional packing density. The constituent chiplets may provide complex features and high performance within a smaller form-factor operated at lower power specifications. Moreover, each chiplet may define multiple power domains, operate at different frequencies and different chiplets may manage power/frequency modes independently and. In some instances, two or more chiplets may be operated in mutually exclusive power states. Additionally, operating conditions for an SoC depend on the type, number and arrangement of chiplets included on the substrate in addition to the modes of operation defined by applications. It is necessary to consider power usage by all chiplets in the SoC in order to ensure compliance with power budgets assigned for an application or device.

Conventional chiplet-based implementations suffer from limitations that include complex or difficult interconnect routing, local hotspots arising from routing congestion caused by connection architecture and challenges to signal timing specifications. In certain examples, local hotspots can arise from routing congestion, increased feature complexity and circuit concentrations. In certain examples, signal timing specifications can be compromised due to the necessity for an increased number of isolation clamps due to logic placement, number of voltage domains and reduced floorplan. Long wire crossings between chiplets can cause routing congestion.

Each chiplet in an SoC may be included to perform a specific function or type of function and the configuration of the chiplets can introduce further complexities and challenges for designers. For example, one chiplet may include radio frequency front end circuits that produce high frequency signals ranging up to 5 GHz or more, and may further include interfaces that are used by low-frequency power management circuits. A designer may import previously defined circuit blocks to implement some of the internal functions.

These circuit blocks may be referred to as macros. Imported circuit blocks for a given process technology may be described, characterized or defined by a set of masks, hardware description language, specifications and test data. Commercially available or proprietary circuit blocks may be referred to as hard macros. Hard macros are tested and verified for a set of design and operating specifications. It is common for hard macros and other circuit blocks to define multiple power domains.

Figure 4:
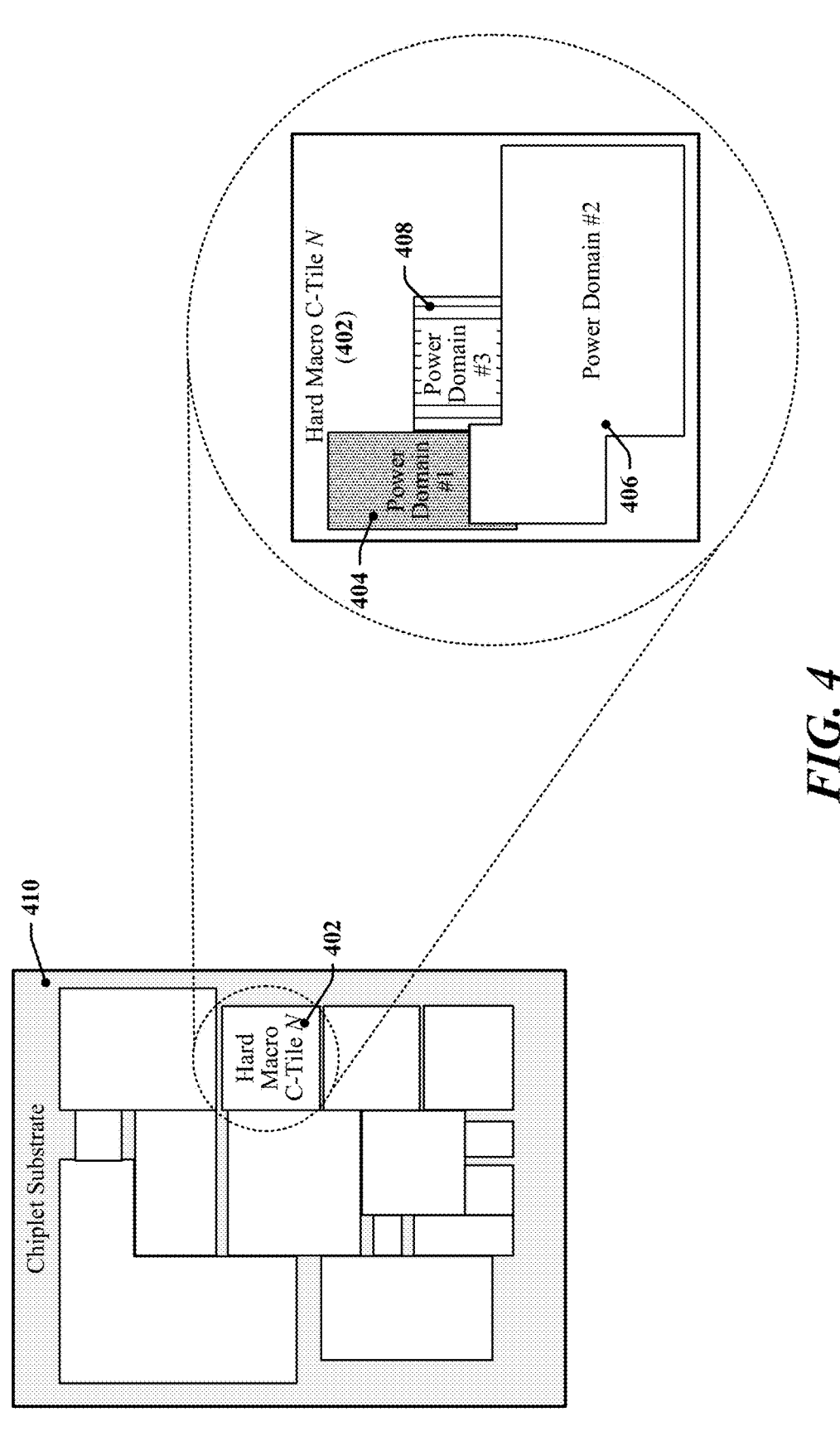
FIG. 4 illustrates a chiplet that includes a number of macros arranged across the surface of a substrate.

FIG. 4 illustrates a chiplet 400 that includes a number of macros arranged across the surface of a substrate 410. This arrangement may be referred to as tiling and each distinct macro may referred to as a C-Tile. In the illustrated example, a hard macro 402 defines three different power domains 404, 406, 408. The complexity of the macros in a chiplet, the number of different instances of power domains and the three-dimensional arrangement of chiplets can produce a highly complex interconnect system that can compromise operability and interoperability of certain chiplets in an SoC. For example, embedded device testing is likely to require an interconnect design that enables test information to be communicated to or from multiple circuit blocks within each voltage domain of each chiplet. In addition to the complex inter-device and intra-device routing, encoders, decoders, multiplexers and shift registers can require large numbers of flipflops and gates and can significantly increase power consumption and can create hotspots within chiplets.

Certain aspects of this disclosure relate to interconnect and embedded device testing architectures that can alleviate signal routing complexity and facilitate low power operation for an SoC that is constructed using multiple dies arranged within a small space. An embedded device test (EDT) architecture implemented in accordance with certain aspects of the disclosure can reduce spatial congestion through the use of broadcast communication. Spatial congestion may be reduced by eliminating gating logic used in conventional EDT decoders.

Figure 5:
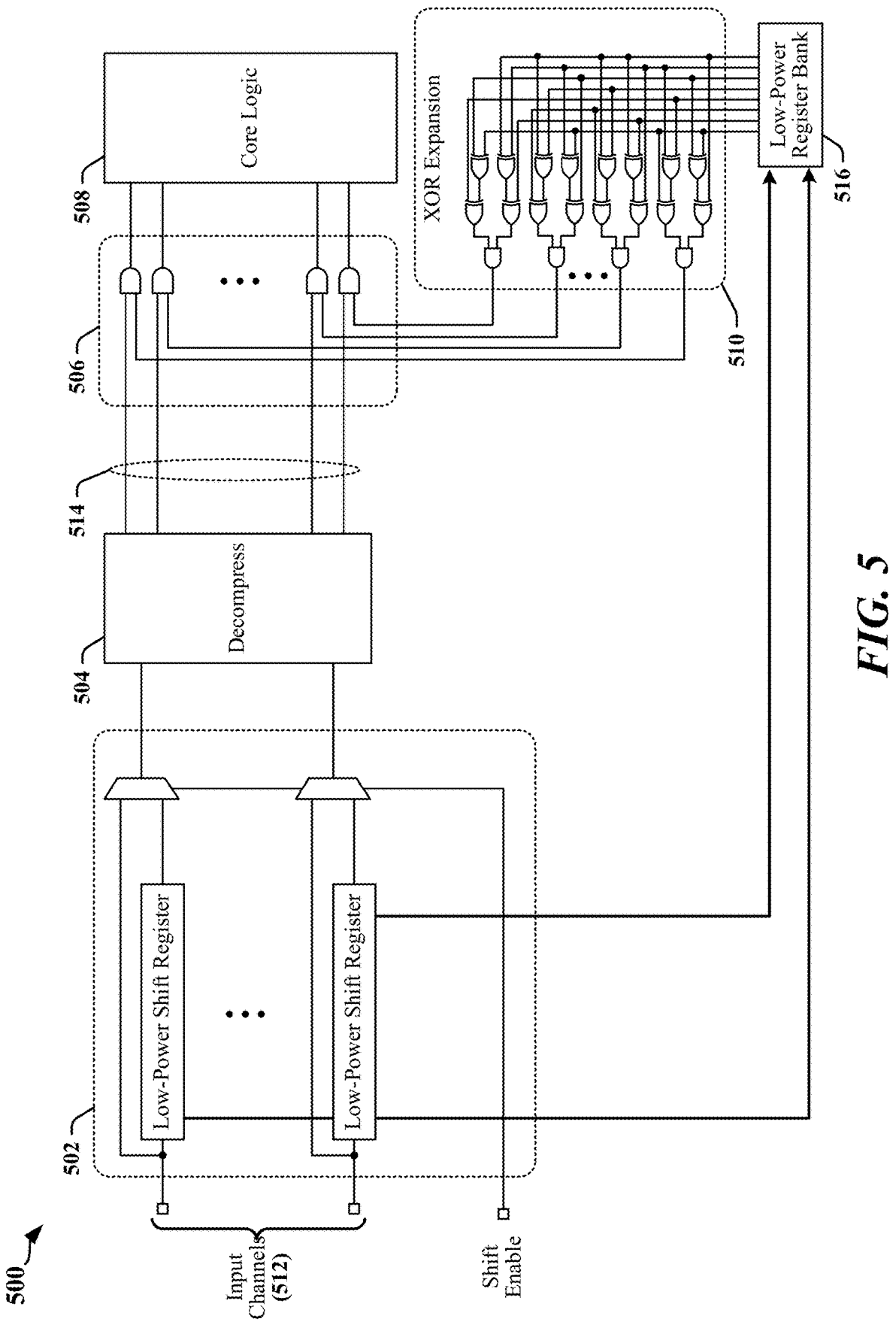
FIG. 5 illustrates an example of a conventional EDT decoder.

FIG. 5 illustrates an example of a conventional EDT decoder 500. When enabled, the EDT decoder 500 receives serialized EDT information from a number of input channels 512. In one example, EDT information received from between 16 to 24 channels is provided to decompressor 504 through a set of shift registers 502. Addressing information captured by a register bank 516 from the set of shift registers 502 is provided to a gating circuit 506 that coupled the outputs of the decompressor 504 to inputs of core logic 508 when enabled. In the illustrated example, exclusive-OR expansion logic 510 generates the gating signals used to gate the outputs of the decompressor 504. In one example, the decompressor 504 provides a total of 2000 or more output signals 514 and a corresponding number of selection circuits is provided in the exclusive-OR expansion logic 510. The exclusive-OR expansion logic 510 occupies considerable silicon real estate and consumes sufficient power to cause thermal hotspots. The routing of gating signals within the exclusive-OR expansion logic 510 and the gating circuit 506 can be difficult and can create congestion and numerous long interconnects.

Figure 6:
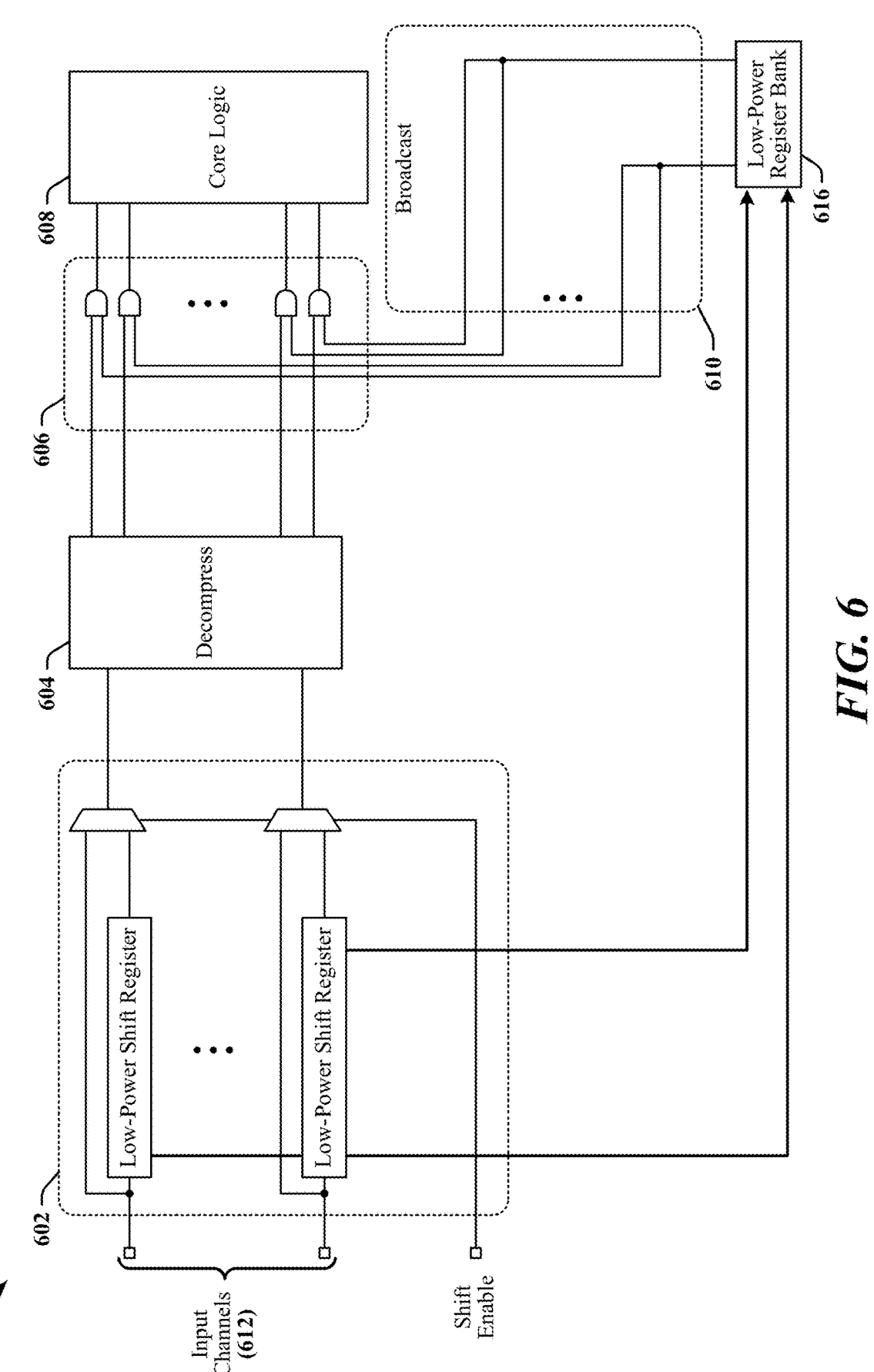
FIG. 6 illustrates an example of an EDT broadcast decoder configured for use in a system that employs broadcast EDT communication in accordance with certain aspects of this disclosure.

FIG. 6 illustrates an example of an EDT broadcast decoder 600 configured for use in a system that employs broadcast EDT communication in accordance with certain aspects of this disclosure. When enabled, the EDT broadcast decoder 600 receives serialized EDT information from multiple input channels 612. In one example, EDT information received from between 16 to 24 channels is provided to decompressor 604 through a set of shift registers 602. The illustrated EDT broadcast decoder 600 includes a gating block 610 that generates gating signals based on outputs of a register bank 616. The register bank 616 receives control or enable information from the set of shift registers 602. In many instances, the gating signals are relatively small in number and the gating block 610 includes no additional logic gates. The gating signals may be used by a gating circuit 606 that is configured to couple the decompressor 604 and core logic 608 when enabled. The gating circuit 606 selectively gates the signals output by the decompressor 604. The reduced number of gating signals and absence of additional logic gates in the gating block 610 can significantly reduce spatial congestion with respect to the conventional EDT decoder 500 illustrated in FIG. 5. The EDT broadcast decoder 600 may be implemented in a hard macro.

In certain examples, the EDT broadcast decoder 600 may be configured using a test data register that may be maintained external to the EDT broadcast decoder 600. The test data register may be configured during a setup procedure to generate gating signals the EDT broadcast decoder 600.

Figure 7:
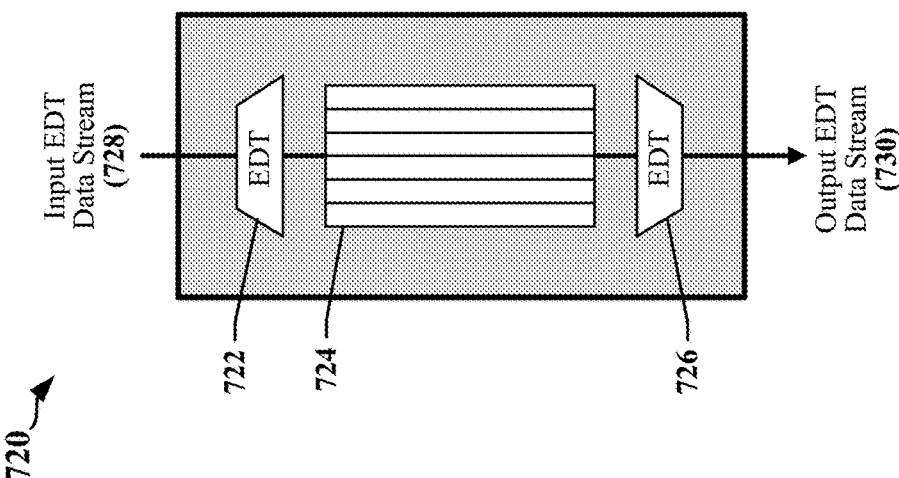
FIG. 7 illustrates an example of a conventional EDT architecture deployed within a single hard macro.
Figure 7:
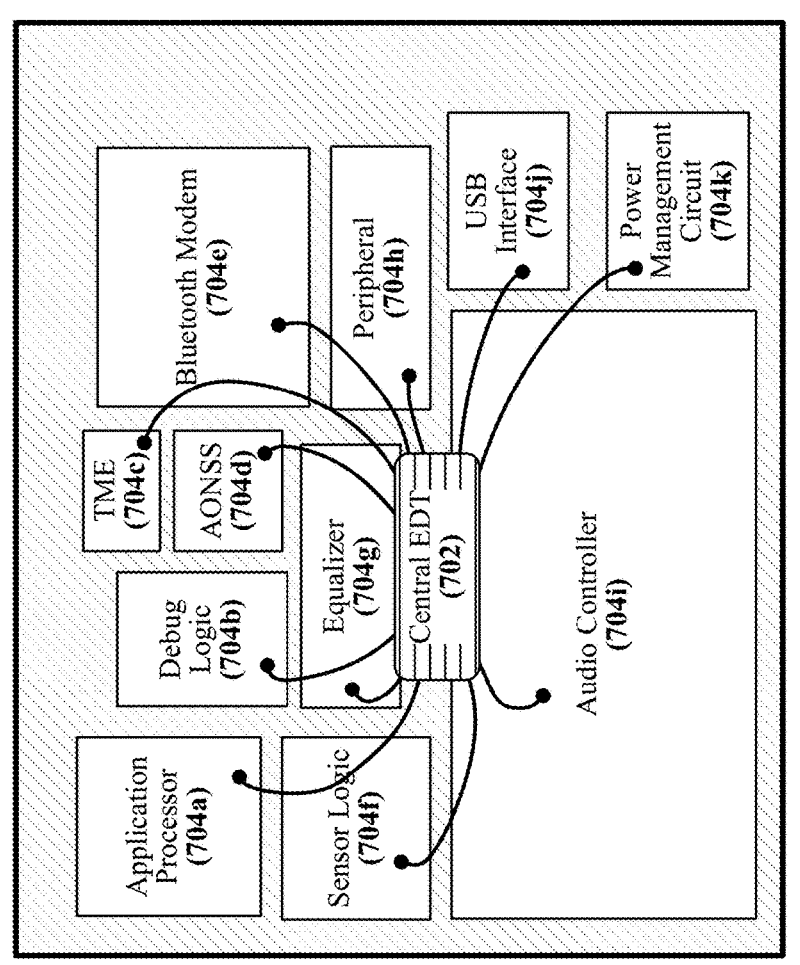

FIG. 7 illustrates an example of a conventional EDT architecture deployed within a single circuit block 700. The circuit block 700 includes multiple circuits or elements 704a-704f that can be configured to perform various distinct or related functions. The circuit block 700 may include one or more hard macros. A central EDT circuit 702 collects EDT information from each circuit or element 704a-704f. A functional representation of the central EDT circuit 702 is shown generally at 720. A received input EDT data stream 728 is expanded by a demultiplexing circuit 722 to provide a number of EDT channels 724. The number of EDT channels 724 may be selected based on the number and complexity of circuits or elements 704a-704f provided in the circuit block 700 and may be further determined by the overall structure and complexity of the tile in which the circuit block 700 is implemented. Data harvested from the circuits or elements 704a-704f of the circuit block 700 are inserted into the EDT channels 724. The EDT channels 724 are multiplexed into an output EDT data stream 730 by a multiplexing circuit 726.

The conventional EDT architecture can produce hotspots and wiring congestion, with many wire crossings needed to carry information between the circuits or elements 704a-704f of the circuit block 700 and the central EDT circuit 702.

Certain aspects of this disclosure relate to a partitioned EDT architecture in which multiple instances of EDT logic are provided in one or more circuit blocks of a tile or chiplet. Certain regions of the circuit blocks may be partitioned for EDT purposes and at least one instance of EDT logic provided in each partition. In some examples, a circuit block is partitioned into sections that group blocks of logic or logic circuits in order to limit the number of wire crossings needed for EDT purposes. In some examples, a circuit block is partitioned into sections that correspond to voltage domains and each partition includes logic circuits powered by the corresponding voltage domain. In some instances, EDT logic is provided within each partitioned voltage domain, thereby simplifying the EDT interface circuits between logic domains. In some implementations, the presently disclosed EDT architecture is hierarchical in nature. In one example, a central EDT circuit allocates channels to local EDT circuits. In another example, first-level partitions can be assigned according to voltage domain and second-level partitions designated within the voltage domains can be assigned to logic blocks within one or more voltage domains.

Figure 8:
FIG. 8 illustrates a first example of a partitioned EDT architecture provided in accordance with certain aspects of this disclosure.

FIG. 8 illustrates a first example of a partitioned EDT architecture 800 provided in accordance with certain aspects of this disclosure. A received input EDT data stream 810 is provided to a set of EDT circuits 802a-802d. The EDT data stream 810 includes a number of EDT channels. Each of the EDT circuits 802a-802d may be configured to extract a portion of the EDT channels from the input EDT data stream 810 such that the available channels in the input EDT data stream 810 are distributed among the EDT circuits 802a-802d.

Each of the EDT circuits 802a-802d includes a demultiplexing circuit 804a-804d that extracts a preconfigured set of EDT channels 806a-806d. Each demultiplexing circuit 804a-804d may be preconfigured to extract EDT channels 806a-806d from the input EDT data stream 810 based on the type and number of logic circuits and/or voltage domains within the corresponding partition. In some instances, the number of the EDT channels 806a-806d extracted by each demultiplexing circuit 804a-804d can be configured based on the number and complexity of the partition covered by the demultiplexing circuit 804a-804d. The total number of channels in the input EDT data stream 810 may be determined by the overall structure and complexity of the chiplet or tile in which the EDT circuits 802a-802d are deployed. Data harvested from the various partitions are inserted into corresponding EDT channels 806a-806d. The modified EDT channels 806a-806d are multiplexed into an output EDT data stream 812 by corresponding multiplexing circuits 808a-808d.

Figure 9:
FIG. 9 illustrates a second example of a partitioned EDT architecture provided in accordance with certain aspects of this disclosure.

FIG. 9 illustrates a second example of a partitioned EDT architecture 900 provided in accordance with certain aspects of this disclosure. The partitioned EDT architecture 900 illustrated in FIG. 9 corresponds in many respects to the EDT architecture 800 illustrated in FIG. 8. In the second example, a demultiplexer 914 in a central EDT circuit receives an input EDT data stream 910 and allocates EDT channels 906a-906d among a set of EDT circuits 902a-902d such that the available channels in the input EDT data stream 910 is distributed among the EDT circuits 902a-902d. In the illustrated example, the available channels in the input EDT data stream 910 are allocated multiple EDT channels. In some implementations, a decoder such as the EDT broadcast decoder 600 illustrated in FIG. 6 may be included in each EDT circuit 902a-902d.

Each of the EDT circuits 902a-902d includes a demultiplexing circuit 904a-904d that extracts individual channels from its allocated EDT channels 906a-906d. The number of the EDT channels 906a-906d provided to each EDT circuits 902a-902d may be selected based on the type and number of logic circuits and/or voltage domains within the corresponding partition. In some instances, the number of the EDT channels 906a-906d provided to each EDT circuits 902a-902d can be configured based on the number and complexity of the partition covered by the EDT circuits 902a-902d. The total number of channels in the input EDT data stream 910 may be determined by the overall structure and complexity of the chiplet or tile in which the EDT circuits 902a-902d are deployed. Data harvested from the various partitions are inserted into corresponding EDT channels 906a-906d. The modified EDT channels 906a-906d are multiplexed by corresponding multiplexing circuits 908a-908d and provided to a multiplexer 916 in the central EDT circuit which in turn multiplexes the outputs of the EDT circuits 902a-902d into an output EDT data stream 912.

Figure 10:
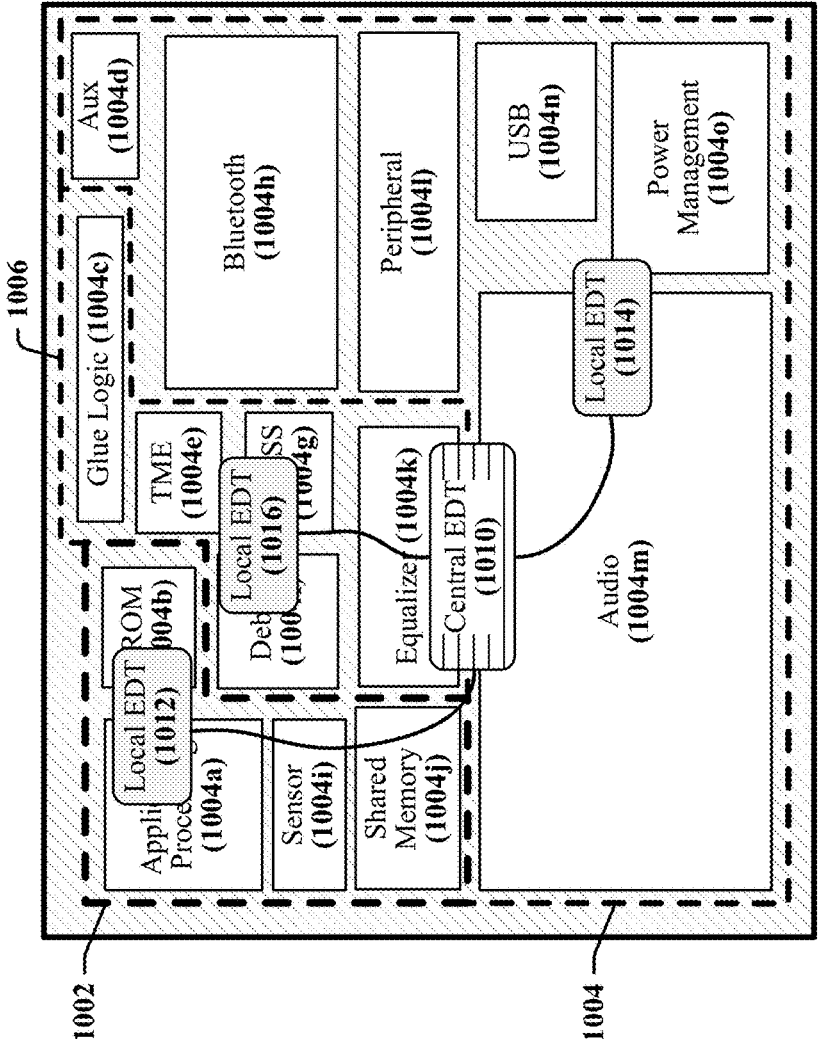
FIG. 10 illustrates an example of a partitioned EDT architecture provided with a partitioned hard macro in accordance with certain aspects of this disclosure.

FIG. 10 illustrates an example of a partitioned EDT architecture provided within a circuit block 1000 that has been partitioned in accordance with certain aspects of this disclosure. The partitioned circuit block 1000 includes multiple circuits or elements 1004a-1004o that can be configured to perform various distinct or related functions. In this example, a central EDT circuit 1010 receives the input EDT data stream 910 and provides the output EDT data stream 912 (see FIG. 9). In some implementations, the central EDT circuit 1010 is configured to allocate portions of the EDT channels in the input EDT data stream 910 among multiple local EDT circuits 1012, 1014, 1016. The local EDT circuits 1012, 1014, 1016 may be located within a designated partition 1002, 1004, 1006 of the circuit block 1000, and each EDT circuit 1012, 1014, 1016 may be configured to collect EDT information from circuits or elements within its designated partition 1002, 1004, 1006. In some implementations, the central EDT circuit 1010 may be further configured to collect EDT information from circuits or elements within one or more of the designated partitions 1002, 1004, 1006.

Data harvested from the circuits or elements 1004a-1004o of the circuit block 1000 are inserted into one or more of the EDT channels allocated to the corresponding partition 1002, 1004, 1006. The central EDT circuit 1010 is configured to multiplex the outputs of the local EDT circuits 1012, 1014, 1016 into the output EDT data stream 912. In some implementations, a decoder such as the EDT broadcast decoder 600 illustrated in FIG. 6 may be included in each EDT circuit 1012, 1014, 1016.

The EDT architecture and decoder disclosed herein may be used to implement standards-defined or proprietary test technologies. An example of a standards-defined test technology is the boundary scan testing technology developed by the Joint Test Action Group ("JTAG"), an industry consortium. A chip, such as an SoC, may include JTAG circuitry that enables signals on individual pins to be input and output in a test mode. A circuit element known as a boundary scan "cell" in the physical interface is interposed in the input/output data signal path between subsystem core logic and the corresponding signal pin. The boundary scan cells are arranged in a chain to form a serial scan path. The JTAG circuitry enables the boundary scan cells to be written to and read back by shifting test data serially through the chain of cells. Such a boundary scan test feature can be used not only to test a chip but also to test the integrity of the signal paths or traces between chiplets in an SoC.

Figure 11:
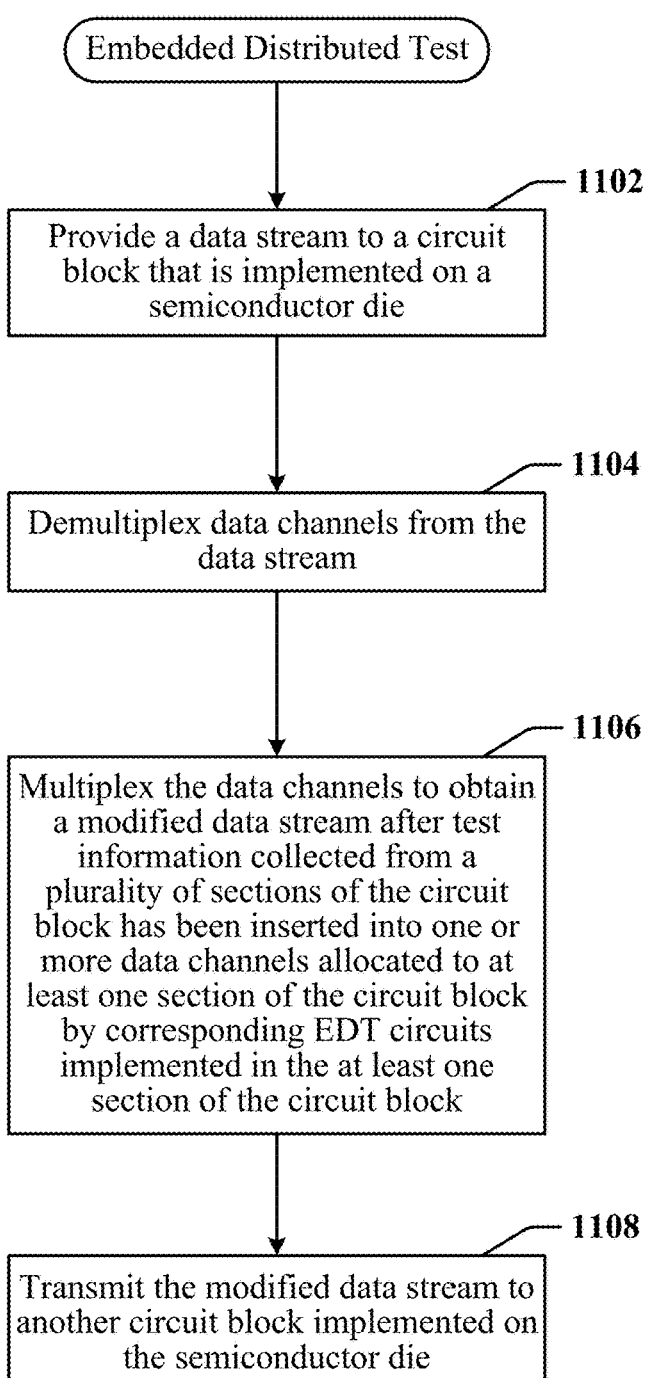
FIG. 11 is a flowchart of a method for communicating test information in accordance with certain aspects of this disclosure.

FIG. 11 is a flowchart 1100 of a method for communicating test information in accordance with certain aspects of this disclosure. In some instances, the method is implemented using one or more processors or controllers in a mobile communication device.

At block 1102 in the illustrated method, a data stream is provided to a circuit block that is implemented on a semiconductor die. At block 1104 in the illustrated method, data channels are demultiplexed from the data stream. At block 1106 in the illustrated method, the data channels are multiplexed to obtain a modified data stream after test information collected from a plurality of sections of the circuit block has been inserted into one or more data channels allocated to at least one section of the circuit block by corresponding EDT circuits implemented in the at least one section of the circuit block. At block 1108 in the illustrated method, the modified data stream is transmitted to another circuit block implemented on the semiconductor die.

In certain examples, each EDT circuit is configured to extract at least one data channel allocated to each EDT circuit and to use a multiplexer to recombine the at least one data channel allocated to each EDT circuit into an output EDT data stream. A portion of the data channels may be distributed to each EDT circuit based on location of the circuit block and an association between the circuit block and each EDT circuit. A central EDT circuit may be configured to distribute the data channels in the data stream among the EDT circuits. The central EDT circuit may be further configured to combine output channels provided by the EDT circuits to obtain the modified data stream.

In various examples, the circuit block includes multiple voltage domains. Each voltage domain may correspond to one of the plurality of sections of the circuit block. The circuit block may be partitioned into sections based on a distribution of interconnects associated with the EDT circuits. The circuit block may be partitioned into sections based on circuit density associated with the EDT circuits. The circuit block may be partitioned into sections to limit a number of isolation clamps associated with the EDT circuits to a predefined maximum.

In some implementations, a decoder circuit may decompress a plurality of channels that include channels modified by the EDT circuits. The plurality of channels may be extracted from a broadcast EDT data stream.

The method illustrated in FIG. 11 may be executed in or using an IC device. The IC device may include multiple semiconductor dice mounted on a substrate. The IC device may be implemented as a chiplet in some instances. In certain applications, at least one semiconductor die may be stacked on at least one other semiconductor die within an IC package. Each semiconductor die includes at least one circuit block configured to implement a function of the integrated circuit device, a plurality of EDT circuits and a central EDT circuit that may be provided in the circuit block and that may be communicatively coupled to each EDT circuit in the plurality of EDT circuits. Each EDT circuit may be configured to collect test information from one of a plurality of sections of the at least one circuit block. The test information collected by each EDT circuit may be inserted into one or more channels of a multiplexed EDT data stream that are allocated to each EDT circuit. For example, An EDT circuit located in a designated section of the circuit block may be configured to transmit EDT information in certain channels of the multiplexed EDT data stream.

The sections of the EDT circuit may be aligned with voltage domains, specified circuit groupings or with some other physical feature of the circuit block. In some examples, designation of the sections of the circuit block may take into consideration locations of heat or electromagnetic interference generation in an adjacent or stacked chiplet. In some examples, designation of the sections of the EDT circuit may take into consideration routing feasibility within the circuit block, within the chiplet that includes the circuit block and/or between the latter chiplet and an adjacent or stacked chiplet.

In various examples, at least one circuit block includes multiple voltage domains, each voltage domain corresponding to one of the plurality of sections of the at least one circuit block. At least one circuit block may be partitioned into sections based on a distribution of interconnects associated with the plurality of EDT circuits. At least one circuit block may be partitioned into sections based on circuit density associated with the plurality of EDT circuits. At least one circuit block may be partitioned into sections to limit a number of isolation clamps associated with the plurality of EDT circuits to a predefined maximum.

In certain implementations, each EDT circuit includes a demultiplexer configured to extract the one or more channels allocated to each EDT circuit and a multiplexer configured to recombine the one or more channels in the multiplexed EDT data stream that are allocated to the each EDT circuit. In some instances, the IC device may include a central EDT circuit configured to distribute a plurality of the channels in the multiplexed EDT data stream to the plurality of EDT circuits. The central EDT circuit may be further configured to distribute a plurality of channels in the multiplexed EDT data stream to the plurality of EDT circuits. The test information collected by each EDT circuit can be inserted into a channel that is distributed to the each EDT circuit.

In some implementations, the integrated circuit device includes a decoder configured to decompress a plurality of channels that includes channels modified by the plurality of EDT circuits. The plurality of channels may be extracted from a broadcast EDT data stream.

An apparatus provided in accordance with certain aspects of this disclosure provides means for providing a data stream to a circuit block that is implemented on a semiconductor die; means for demultiplexing data channels from the data stream; and means for multiplexing the data channels to obtain a modified data stream after test information collected from a plurality of sections of the circuit block has been inserted into one or more data channels allocated to at least one section of the circuit block by corresponding EDT circuits implemented in the at least one section of the circuit block. The modified data stream may be transmitted to another circuit block implemented on the semiconductor die.

In one example, each EDT circuit is configured to extract at least one data channel allocated to each EDT circuit and to use a multiplexer to recombine the at least one data channel allocated to each EDT circuit into an output EDT data stream. The apparatus may include means for distributing a portion of the data channels to each EDT circuit based on location of the circuit block and an association between the circuit block and each EDT circuit. In some examples, a central EDT circuit is configured to distribute the data channels in the data stream among the EDT circuits. The central EDT circuit may be further configured to combine output channels provided by the EDT circuits to obtain the modified data stream.

In some examples, the circuit block includes multiple voltage domains, each voltage domain corresponding to one of the plurality of sections of the circuit block. The circuit block may be partitioned into sections based on a distribution of interconnects associated with the EDT circuits. The circuit block may be partitioned into sections based on circuit density associated with the EDT circuits. The circuit block may be partitioned into sections to limit a number of isolation clamps associated with the EDT circuits to a predefined maximum.

In certain implementations, the apparatus includes means for decompressing a plurality of channels that include channels modified by the EDT circuits. The plurality of channels may be extracted from a broadcast EDT data stream.

Some implementation examples are described in the following numbered clauses:

1. An integrated circuit device, comprising: two or more semiconductor dice, each semiconductor die comprising: at least one circuit block configured to implement a function of the integrated circuit device; and a plurality of embedded distributed test (EDT) circuits, each EDT circuit being configured to collect test information from one of a plurality of sections of the circuit block; and a central EDT circuit provided in the circuit block and communicatively coupled to each EDT circuit in the plurality of EDT circuits.

2. The integrated circuit device as described in clause 1, wherein each EDT circuit comprises: a demultiplexer configured to extract one or more channels in a multiplexed EDT data stream that are allocated to the each EDT circuit; and a multiplexer configured to recombine the one or more channels that are allocated to the each EDT circuit into an output EDT data stream.

3. The integrated circuit device as described in clause 1 or clause 2, wherein the central EDT circuit is configured to: distribute a plurality of channels in a multiplexed EDT data stream to the plurality of EDT circuits, wherein the test information collected by each EDT circuit is inserted into a channel that is distributed to the each EDT circuit.

4. The integrated circuit device as described in clause 3, wherein the central EDT circuit is further configured to combine channels output by the plurality of EDT circuits to obtain an output data test data stream.

5. The integrated circuit device as described in any of clauses 1-4, wherein at least one circuit block includes multiple voltage domains, each voltage domain corresponding to one of the plurality of sections of the at least one circuit block.

6. The integrated circuit device as described in any of clauses 1-5, wherein at least one circuit block is partitioned into sections based on a distribution of interconnects associated with the plurality of EDT circuits.

7. The integrated circuit device as described in any of clauses 1-6, wherein at least one circuit block is partitioned into sections based on circuit density associated with the plurality of EDT circuits.

8. The integrated circuit device as described in any of clauses 1-7, wherein at least one circuit block is partitioned into sections to limit a number of isolation clamps associated with the plurality of EDT circuits to a predefined maximum.

9. The integrated circuit device as described in any of clauses 1-8, further comprising: a decoder configured to decompress a plurality of channels that includes channels modified by the plurality of EDT circuits, wherein the plurality of channels is extracted from a broadcast EDT data stream.

10. A method for communicating test information, comprising: providing a data stream to a circuit block that is implemented on a semiconductor die; demultiplexing data channels from the data stream; multiplexing the data channels to obtain a modified data stream after test information collected from a plurality of sections of the circuit block has been inserted into one or more data channels allocated to at least one section of the circuit block by corresponding embedded distributed test (EDT) circuits implemented in the at least one section of the circuit block; and transmitting the modified data stream to another circuit block implemented on the semiconductor die.

11. The method as described in clause 10, wherein each EDT circuit is configured to: extract at least one data channel allocated to the each EDT circuit; and use a multiplexer to recombine the at least one data channel allocated to the each EDT circuit into an output EDT data stream.

12. The method as described in clause 10 or clause 11, further comprising: distributing a portion of the data channels to each EDT circuit based on location of the circuit block and an association between the circuit block and the each EDT circuit.

13. The method as described in any of clauses 10-12, wherein a central EDT circuit is configured to distribute the data channels in the data stream among the EDT circuits.

14. The method as described in clause 13, wherein the central EDT circuit is further configured to combine output channels provided by the EDT circuits to obtain the modified data stream.

15. The method as described in any of clauses 10-14, wherein the circuit block includes multiple voltage domains, each voltage domain corresponding to one of the plurality of sections of the circuit block.

16. The method as described in any of clauses 10-15, wherein the circuit block is partitioned into sections based on a distribution of interconnects associated with the EDT circuits.

17. The method as described in any of clauses 10-16, wherein the circuit block is partitioned into sections based on circuit density associated with the EDT circuits.

18. The method as described in any of clauses 10-17, wherein the circuit block is partitioned into sections to limit a number of isolation clamps associated with the EDT circuits to a predefined maximum.

19. The method as described in any of clauses 10-18, further comprising: decompressing a plurality of channels that include channels modified by the EDT circuits, wherein the plurality of channels is extracted from a broadcast EDT data stream.

20. An apparatus, comprising: means for providing a data stream to a circuit block that is implemented on a semiconductor die; means for demultiplexing data channels from the data stream; and means for multiplexing the data channels to obtain a modified data stream after test information collected from a plurality of sections of the circuit block has been inserted into one or more data channels allocated to at least one section of the circuit block by corresponding embedded distributed test (EDT) circuits implemented in the at least one section of the circuit block, wherein the modified data stream is transmitted to another circuit block implemented on the semiconductor die.

21. The apparatus as described in clause 20, wherein each EDT circuit is configured to: extract at least one data channel allocated to the each EDT circuit; and use a multiplexer to recombine the at least one data channel allocated to the each EDT circuit into an output EDT data stream.

22. The apparatus as described in clause 20 or clause 21, further comprising: means for distributing a portion of the data channels to each EDT circuit based on location of the circuit block and an association between the circuit block and the each EDT circuit.

23. The apparatus as described in any of clauses 20-22, wherein a central EDT circuit is configured to distribute the data channels in the data stream among the EDT circuits.

24. The apparatus as described in clause 23, wherein the central EDT circuit is further configured to combine output channels provided by the EDT circuits to obtain the modified data stream.

25. The apparatus as described in any of clauses 20-24, wherein the circuit block includes multiple voltage domains, each voltage domain corresponding to one of the plurality of sections of the circuit block.

26. The apparatus as described in any of clauses 20-25, wherein the circuit block is partitioned into sections based on a distribution of interconnects associated with the EDT circuits.

27. The apparatus as described in any of clauses 20-26, wherein the circuit block is partitioned into sections based on circuit density associated with the EDT circuits.

28. The apparatus as described in any of clauses 20-27, wherein the circuit block is partitioned into sections to limit a number of isolation clamps associated with the EDT circuits to a predefined maximum.

29. The apparatus as described in any of clauses 20-28, further comprising: means for decompressing a plurality of channels that include channels modified by the EDT circuits, wherein the plurality of channels is extracted from a broadcast EDT data stream.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An integrated circuit device, comprising:
two or more semiconductor dice, each semiconductor die comprising:
a circuit block configured to implement a function of the integrated circuit device, wherein the circuit block is partitioned into a plurality of embedded distributed test (EDT) sections; and
a plurality of EDT circuits, wherein at least one EDT circuit is provided in each EDT section in the plurality of EDT sections, and wherein each of the plurality of EDT circuits is configured to collect test information from a corresponding EDT section; and
a central EDT circuit provided in the circuit block and configured to:
distribute a plurality of EDT channels from a received EDT data stream among the plurality of EDT circuits such that each EDT circuit receives a subset of EDT channels allocated to a corresponding EDT section; and
receive an input from each EDT circuit in the plurality of EDT circuits and to provide an output EDT data stream by multiplexing the input received from the each EDT circuit with inputs received from other EDT circuits in the plurality of EDT circuits.

2. The integrated circuit device of claim 1, wherein each EDT circuit comprises:
a demultiplexer configured to extract one or more channels in a multiplexed EDT data stream that are allocated to the each EDT circuit; and
a multiplexer configured to recombine the one or more channels that are allocated to the each EDT circuit into the output EDT data stream.

3. The integrated circuit device of claim 1, wherein the central EDT circuit is configured to:
distribute a plurality of channels in a multiplexed EDT data stream to the plurality of EDT circuits, wherein the test information collected by each EDT circuit is inserted into a channel that is distributed to the each EDT circuit.

4. The integrated circuit device of claim 3, wherein the central EDT circuit is further configured to combine channels output by the plurality of EDT circuits to obtain the output EDT data stream.

5. The integrated circuit device of claim 1, wherein the circuit block includes multiple voltage domains, each voltage domain corresponding to one of the plurality of EDT sections.

6. The integrated circuit device of claim 1, wherein the circuit block is partitioned into the plurality of EDT sections based on a distribution of interconnects associated with the plurality of EDT circuits.

7. The integrated circuit device of claim 1, wherein the circuit block is partitioned into the plurality of EDT sections based on circuit density associated with the plurality of EDT circuits.

8. The integrated circuit device of claim 1, wherein the circuit block is partitioned into the plurality of EDT sections to limit a number of isolation clamps associated with the plurality of EDT circuits to a predefined maximum.

9. The integrated circuit device of claim 1, further comprising:
a decoder configured to decompress a plurality of channels that includes channels modified by the plurality of EDT circuits, wherein the plurality of channels is extracted from a broadcast EDT data stream.

10. A method for communicating test information, comprising:
providing an embedded distributed test (EDT) data stream to a circuit block that is implemented on a semiconductor die, wherein the circuit block is partitioned into a plurality of EDT sections and at least one EDT circuit is provided in each EDT section in the plurality of EDT sections;
demultiplexing EDT data channels from the EDT data stream at a central EDT circuit;
distributing, at the central EDT circuit, the EDT data channels among the plurality of EDT sections such that each EDT circuit receives a subset of the EDT data channels allocated to a corresponding EDT section;
multiplexing the EDT data channels at the central EDT circuit to obtain a modified EDT data stream after test information collected by the central EDT circuit from each of the plurality of EDT sections has been inserted into one or more EDT data channels allocated to the plurality of EDT sections of the circuit block by corresponding EDT circuits; and
transmitting the modified EDT data stream from the central EDT circuit to another circuit block implemented on the semiconductor die.

11. The method of claim 10, wherein each EDT circuit is configured to:
extract at least one EDT data channel allocated to the each EDT circuit; and
use a multiplexer to recombine the at least one EDT data channel allocated to the each EDT circuit into an output EDT data stream.

12. The method of claim 10, further comprising:
distributing a portion of the EDT data channels to each EDT circuit based on location of the circuit block and an association between the circuit block and the each EDT circuit.

13. The method of claim 10, wherein the central EDT circuit is configured to distribute the EDT data channels in the EDT data stream among the EDT circuits.

14. The method of claim 13, wherein the central EDT circuit is further configured to combine output EDT data channels provided by the EDT circuits to obtain the modified EDT data stream.

15. The method of claim 10, wherein the circuit block includes multiple voltage domains, each voltage domain corresponding to one of the plurality of EDT sections.

16. The method of claim 10, wherein the circuit block is partitioned into the plurality of EDT sections based on a distribution of interconnects associated with the EDT circuits.

17. The method of claim 10, wherein the circuit block is partitioned into the plurality of EDT sections based on circuit density associated with the EDT circuits.

18. The method of claim 10, wherein the circuit block is partitioned into the plurality of EDT sections to limit a number of isolation clamps associated with the EDT circuits to a predefined maximum.

19. The method of claim 10, further comprising:

decompressing a plurality of channels that include the EDT data channels modified by the EDT circuits, wherein the EDT channels is extracted from a broadcast EDT data stream.

20. An apparatus, comprising:

means for providing a data stream to a circuit block that is implemented on a semiconductor die, wherein the circuit block is partitioned into a plurality of embedded distributed test (EDT) sections and at least one EDT circuit is provided in each EDT section in the plurality of EDT sections and to distribute data channels from the data stream among the plurality of EDT sections such that each EDT circuit receives a subset of EDT channels allocated to a corresponding EDT section;

means for demultiplexing the data channels from the data stream, including a central EDT circuit that is configured to receive an input from the at least one EDT circuit in each EDT section; and means for multiplexing the data channels to obtain a modified data stream after test information collected from the plurality of EDT sections has been inserted into one or more data channels allocated to the plurality of EDT sections of the circuit block by corresponding EDT circuits, wherein the test information is received by the central EDT circuit in inputs provided by the at least one EDT circuit in each EDT section in the plurality of EDT sections, wherein the modified data stream is transmitted by the central EDT circuit to another circuit block implemented on the semiconductor die.

21. The apparatus of claim 20, wherein each EDT circuit is configured to:

extract at least one data channel allocated to the each EDT circuit; and use a multiplexer to recombine the at least one data channel allocated to the each EDT circuit into an output EDT data stream.

22. The apparatus of claim 20, further comprising:

means for distributing a portion of the data channels to each EDT circuit based on location of the circuit block and an association between the circuit block and the each EDT circuit.

23. The apparatus of claim 20, wherein the central EDT circuit is configured to distribute the data channels in the data stream among the EDT circuits.

24. The apparatus of claim 23, wherein the central EDT circuit is further configured to combine output channels provided by the EDT circuits to obtain the modified data stream.

25. The apparatus of claim 20, wherein the circuit block includes multiple voltage domains, each voltage domain corresponding to one of the plurality of EDT sections.

26. The apparatus of claim 20, wherein the circuit block is partitioned into the plurality of EDT sections based on a distribution of interconnects associated with the EDT circuits.

27. The apparatus of claim 20, wherein the circuit block is partitioned into the plurality of EDT sections based on circuit density associated with the EDT circuits.

28. The apparatus of claim 20, wherein the circuit block is partitioned into the plurality of EDT sections to limit a number of isolation clamps associated with the EDT circuits to a predefined maximum.

29. The apparatus of claim 20, further comprising:

means for decompressing a plurality of channels that include channels modified by the EDT circuits, wherein the plurality of channels is extracted from a broadcast EDT data stream.

* * * * *